(12) United States Patent
Huang et al.

(10) Patent No.: US 11,145,728 B2
(45) Date of Patent: Oct. 12, 2021

(54) SEMICONDUCTOR DEVICE AND METHOD OF FORMING SAME

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Yu-Ming Lin, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 41 days.

(21) Appl. No.: 16/809,876

(22) Filed: Mar. 5, 2020

(65) Prior Publication Data

US 2021/0134969 A1   May 6, 2021

Related U.S. Application Data

(60) Provisional application No. 62/928,163, filed on Oct. 30, 2019.

(51) Int. Cl.
| | |
|---|---|
| *H01L 29/417* | (2006.01) |
| *H01L 29/78* | (2006.01) |
| *H01L 29/08* | (2006.01) |
| *H01L 29/66* | (2006.01) |
| *H01L 21/311* | (2006.01) |

(52) U.S. Cl.
CPC .. *H01L 29/41791* (2013.01); *H01L 21/31111* (2013.01); *H01L 29/0847* (2013.01); *H01L 29/66515* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Anthony Ho
*Assistant Examiner* — Kevin Quinto
(74) *Attorney, Agent, or Firm* — Slater Matsil, LLP

(57) ABSTRACT

A method includes forming a gate structure over a fin protruding above a substrate, forming a gate spacer layer on sidewalls of the gate structure, forming an etch stop layer on sidewalls of the gate spacer layer, replacing the gate structure with a gate stack, forming a source/drain contact adjacent the etch stop layer, recessing the gate stack to form a first recess, filling the first recess with a first dielectric material, recessing the source/drain contact and the etch stop layer to form a second recess, filling the second recess with a second dielectric material, recessing the second dielectric material and the gate spacer layer to form a third recess, and filling the third recess with a third dielectric material, wherein the composition of the third dielectric material is different from that of the first dielectric material and the second dielectric material.

20 Claims, 26 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2011/0278676 A1* | 11/2011 | Cheng ............... H01L 27/0924 257/369 |

* cited by examiner

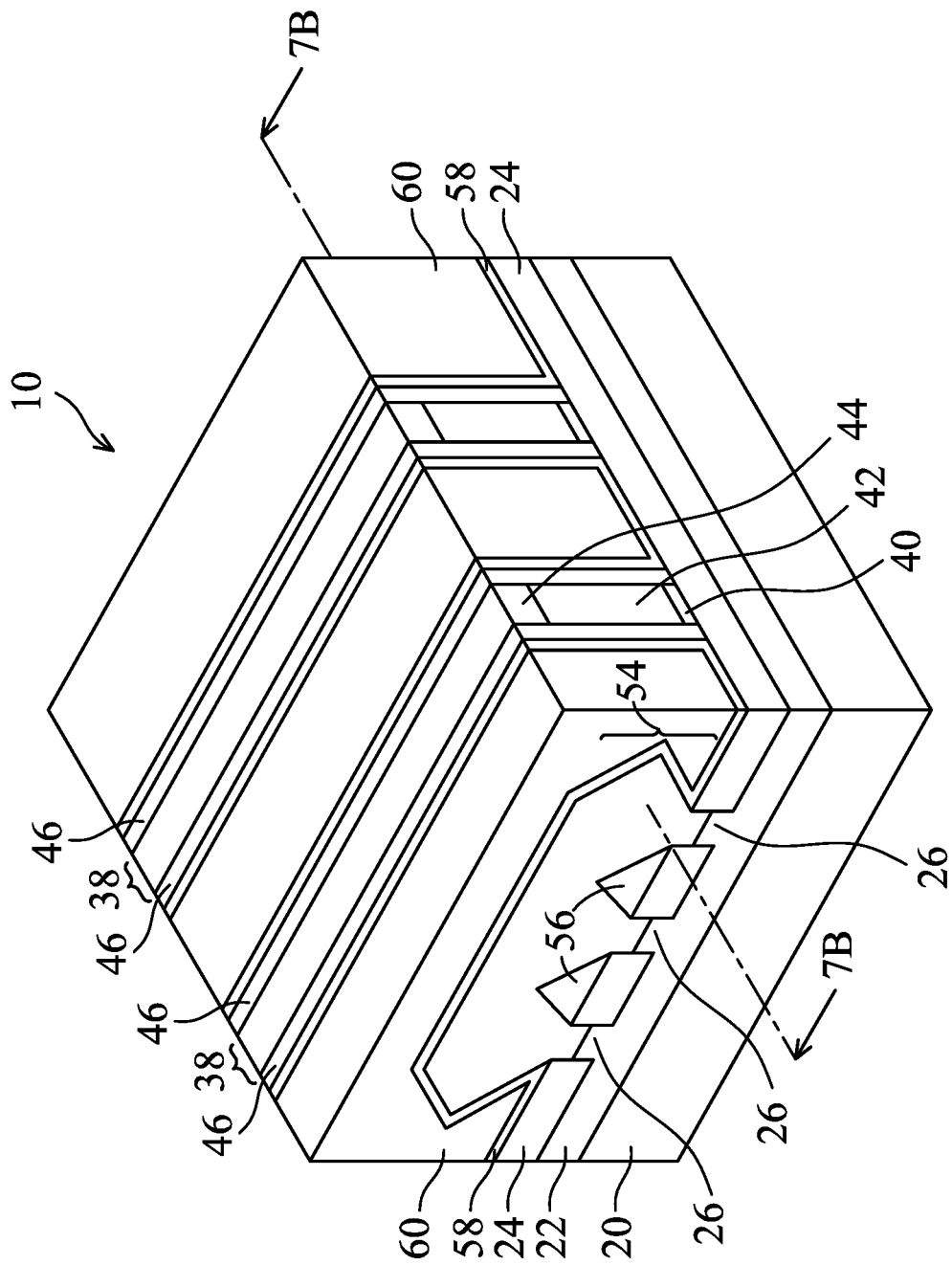

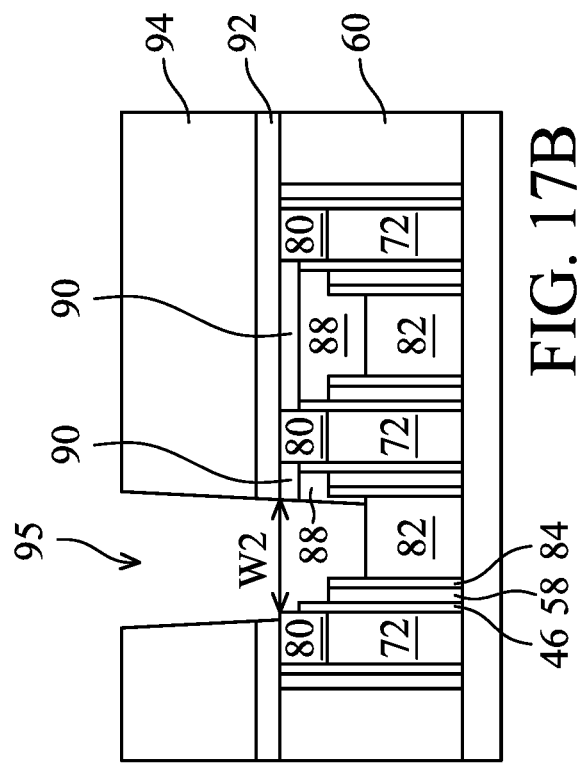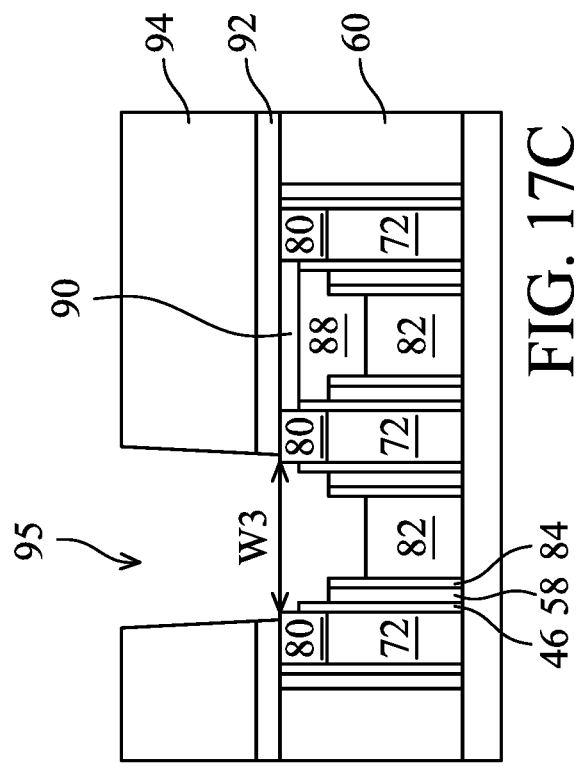

SEMICONDUCTOR DEVICE AND METHOD OF FORMING SAME

PRIORITY CLAIM AND CROSS-REFERENCE

This application claims the benefit of U.S. Provisional Application No. 62/928,163, filed on Oct. 30, 2019, which application is hereby incorporated herein by reference.

BACKGROUND

In the recent development of transistor manufacturing technology, metal are used for forming contact plugs and metal gates. Contact plugs are used for connecting to the source and drain regions and the gates of transistors. The source/drain contact plugs are typically connected to source/drain silicide regions, which are formed by depositing a metal layer, and then performing an anneal to react the metal layer with the silicon in the source/drain regions. The gate contact plugs are used for connecting to the metal gates.

The formation of metal gates may include forming dummy gate stacks, removing the dummy gate stacks to form openings, filling a metallic material into the openings, and performing a planarization to remove excess metallic material in order to form the metal gates. The metal gates are then recessed to form recesses, and dielectric hard masks are filled into the recesses. When the gate contact plugs are formed, the hard masks are removed, so that the gate contact plugs may contact the metal gates.

Source/drain contact plugs are also formed to electrically couple to the source/drain regions. The formation of the source/drain contact plugs include etching Inter-Layer Dielectric (ILD) to form contact openings, and forming source/drain silicide regions and contact plugs in the contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, 7A, 7B, 8, 9A, 9B, 10A, and 10B illustrate perspective views and cross-sectional views of intermediate stages in the formation of a FinFET device in accordance with some embodiments.

FIGS. 11, 12, 13, 14, 15A, 15B, 15C, 15D, 16, 17A, 17B, 17C, 18, 19, 20, 21A, 21B illustrate cross-sectional views of intermediate stages in the formation of source/drain contact plugs and slot gate contact plugs of a FinFET device in accordance with some embodiments.

DETAILED DESCRIPTION

Figure 1:
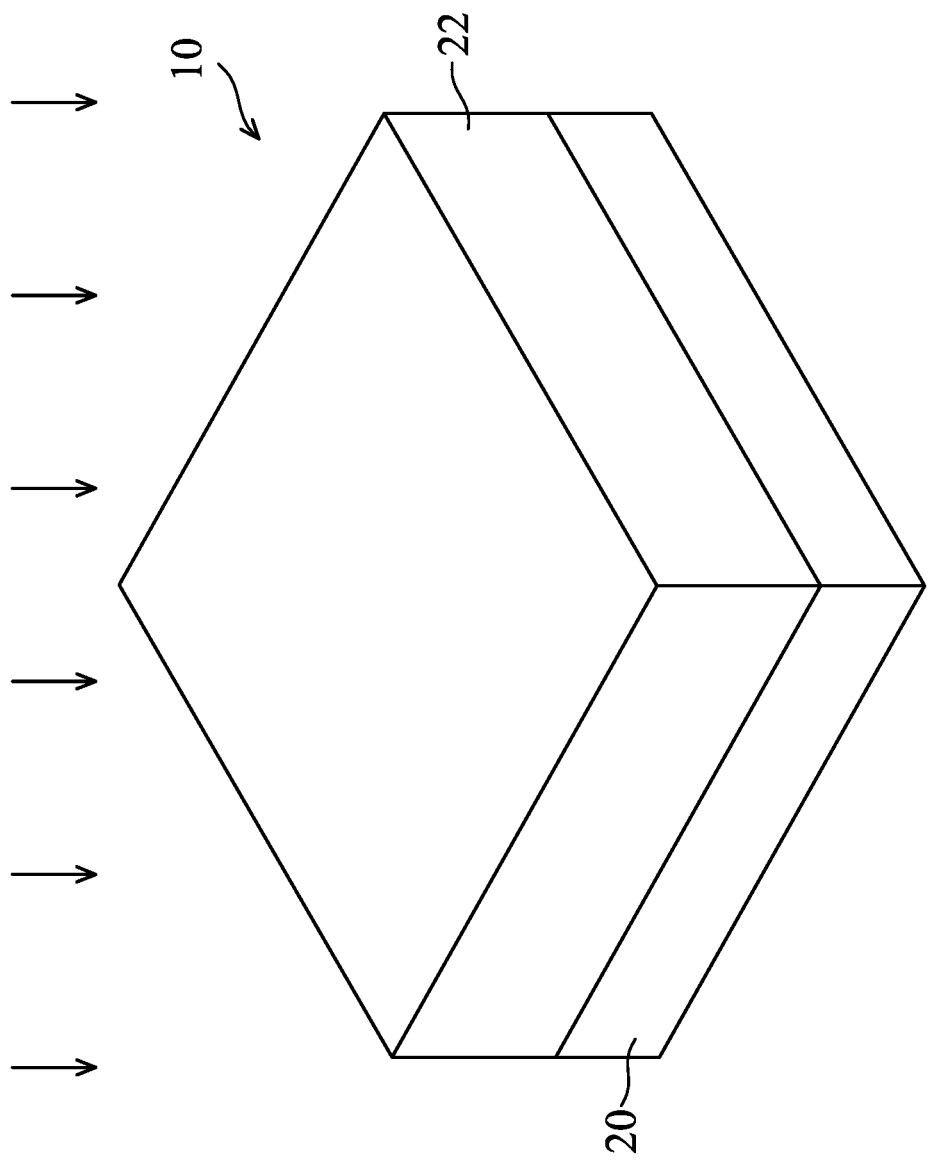

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with source/drain contact plugs and gate contact plugs and the methods of forming the same are provided in accordance with some embodiments. The intermediate stages of forming the source/drain contact plugs and gate contact plugs are illustrated in accordance with some embodiments. Some variations of some embodiments are discussed. Throughout the various views and illustrative embodiments, like reference numbers are used to designate like elements. In some illustrated embodiments, the formation of Fin Field-Effect Transistors (FinFETs) is used as an example to explain the concept of the present disclosure. Planar transistors or nanostructure field-effect transistors (NSFETs) may also adopt the concept of the present disclosure.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
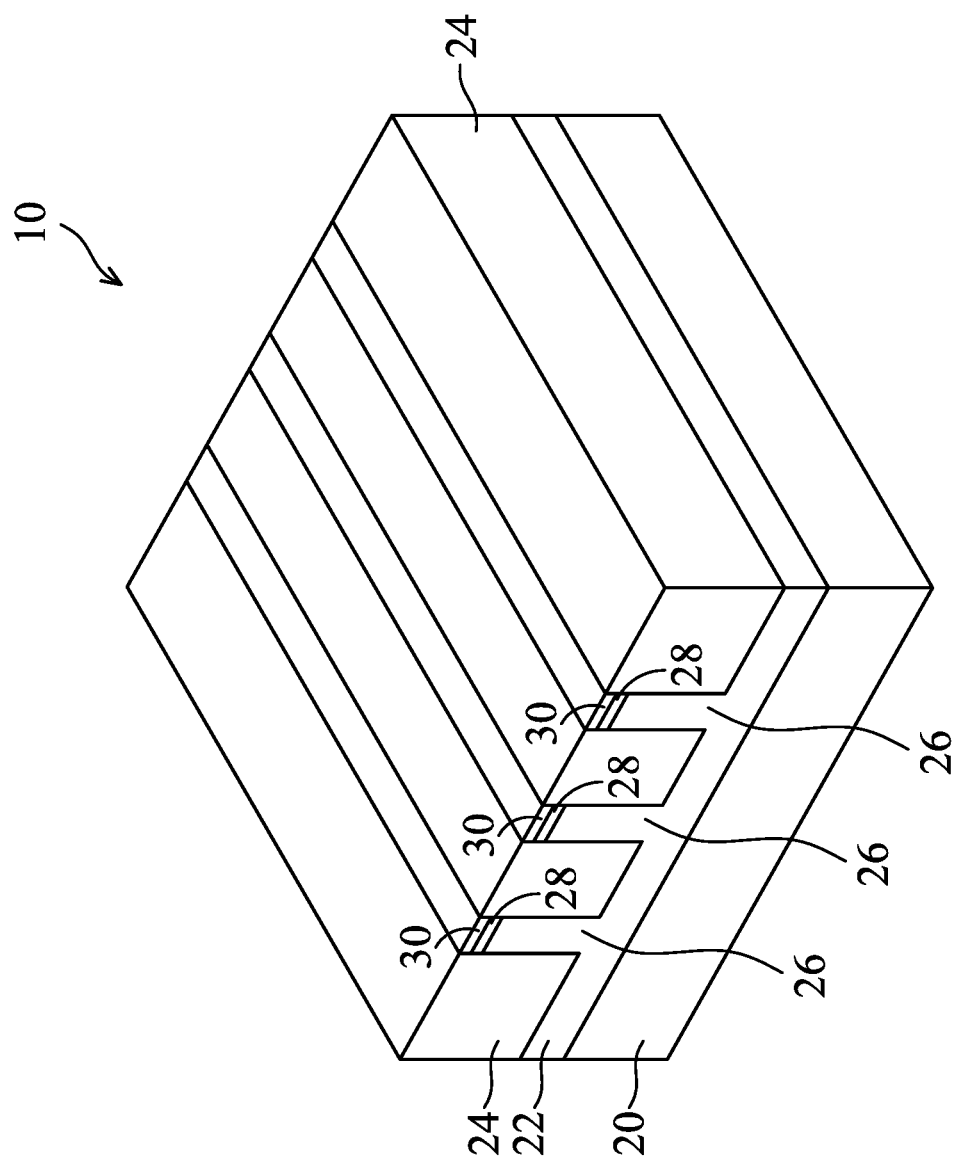

Referring to FIG. 2, isolation regions 24 are formed to extend from a top surface of substrate 20 into substrate 20. Isolation regions 24 are alternatively referred to as Shallow Trench Isolation (STI) regions hereinafter. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
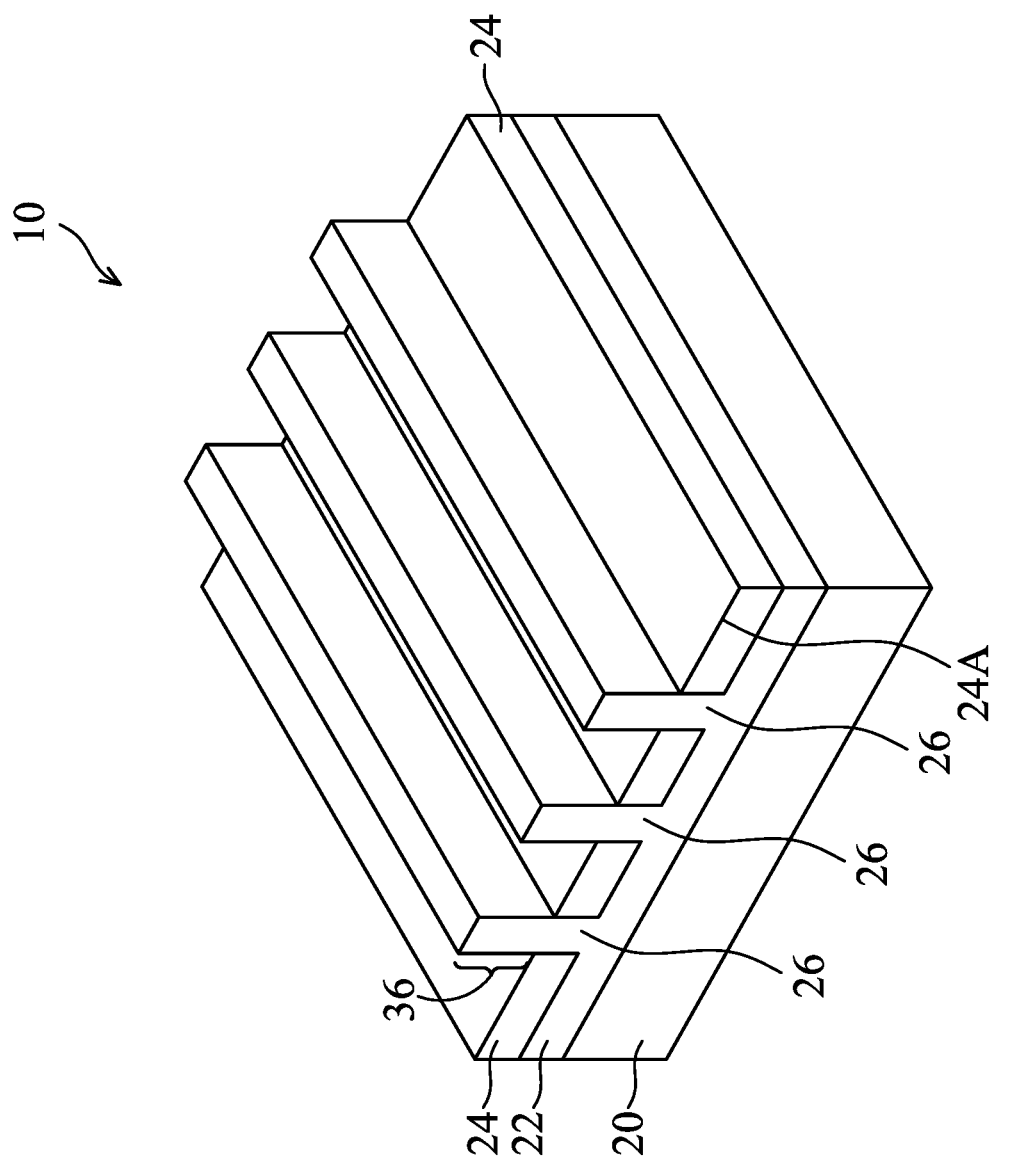

Referring to FIG. 3, STI regions 24 are recessed, so that the top portions of semiconductor strips 26 protrude higher than the top surfaces 24A of the remaining portions of STI regions 24 to form protruding fins 36. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
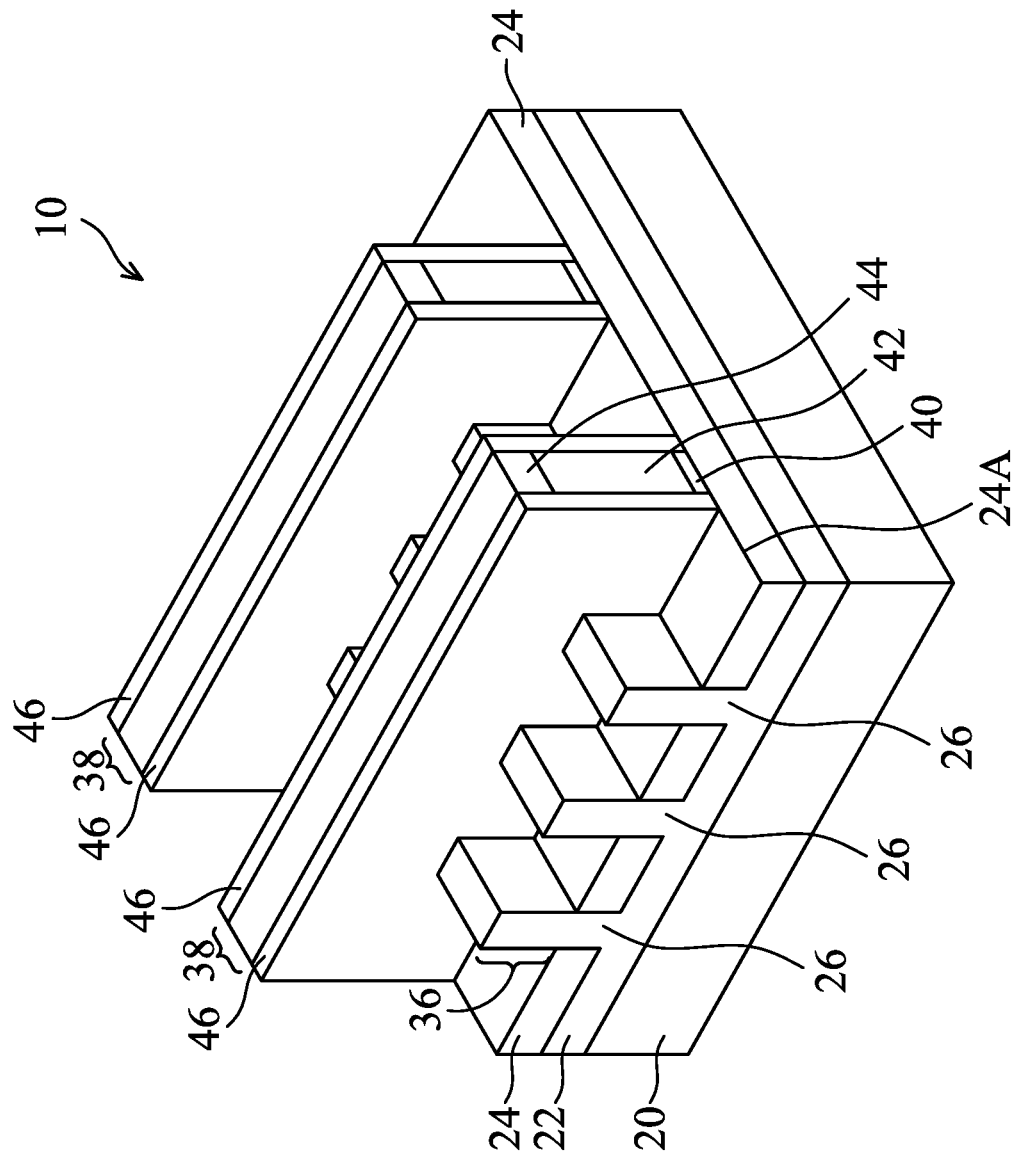

Referring to FIG. 4, dummy gate stacks 38 are formed to extend on the top surfaces and the sidewalls of (protruding) fins 36. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
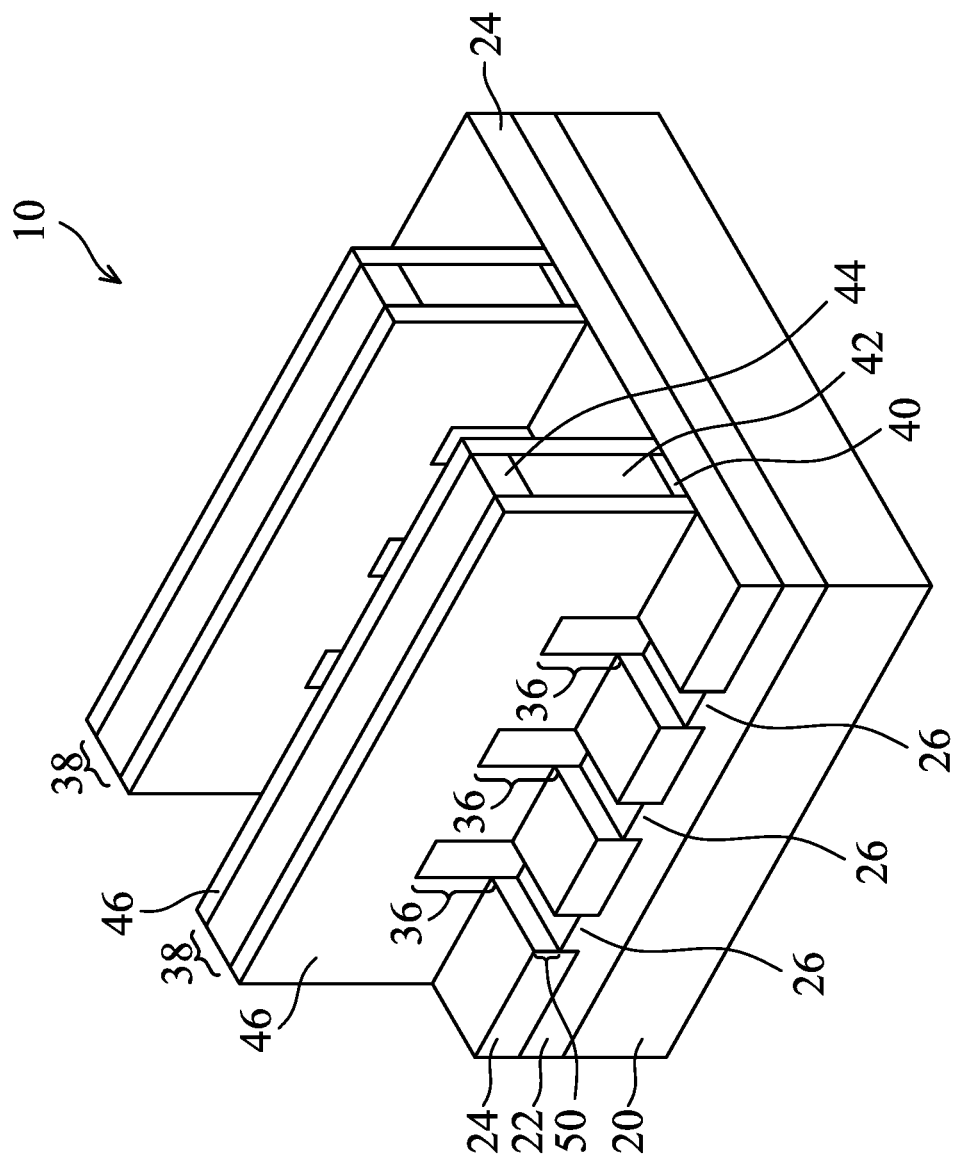

An etching process is then performed to etch the portions of protruding fins 36 that are not covered by dummy gate stacks 38 and gate spacers 46, resulting in the structure shown in FIG. 5. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
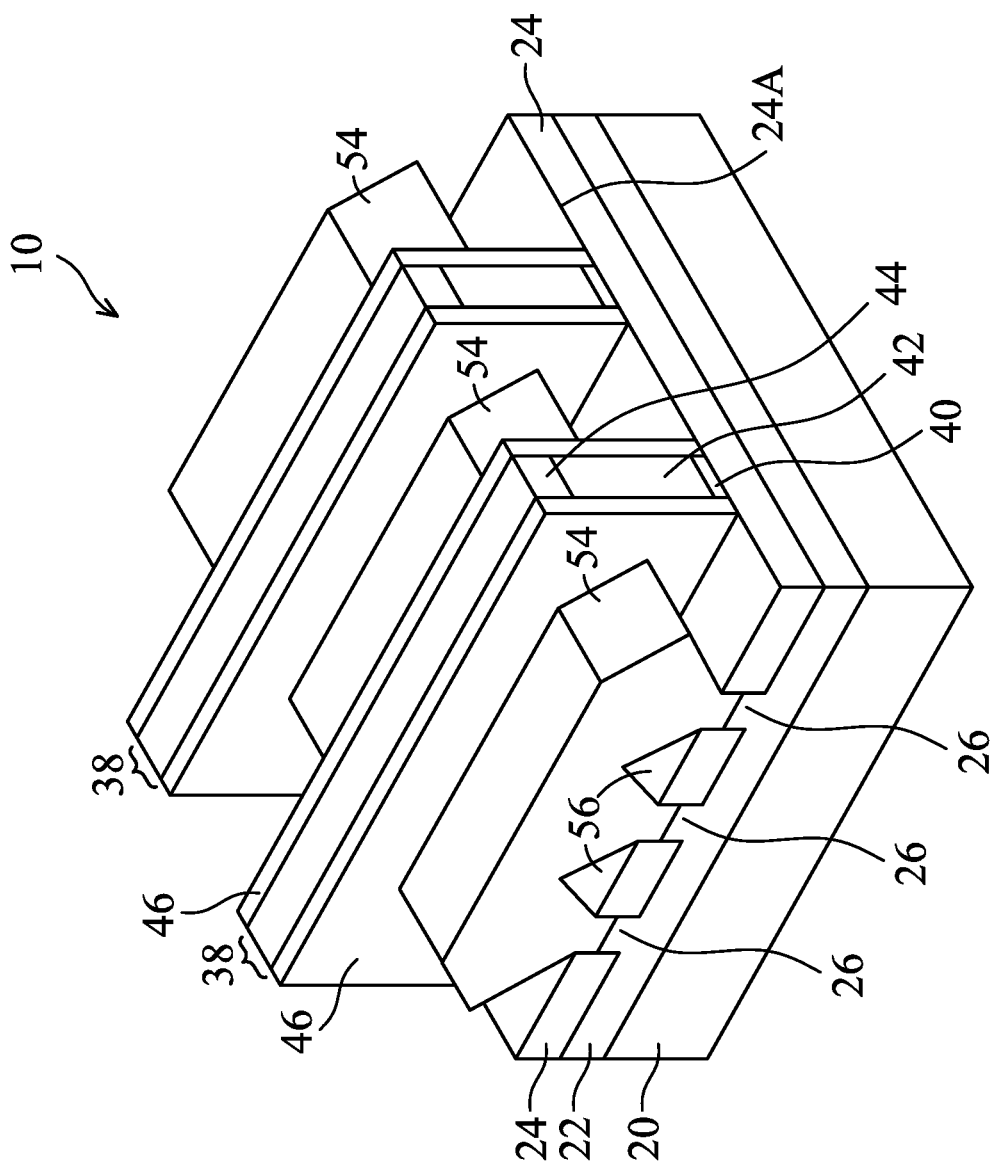

Next, epitaxy regions (source/drain regions) 54 are formed by selectively growing (through epitaxy) a semiconductor material in recesses 50, resulting in the structure in FIG. 6. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, multi-layers thereof, or the like. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become substantially planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

FIG. 7A illustrates a perspective view of the structure after the formation of Contact Etch Stop Layer (CESL) 58 and Inter-Layer Dielectric (ILD) 60. CESL 58 may be formed of a dielectric material, such as SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, the like, or a combination thereof, in some embodiments. CESL 58 may be formed by a suitable formation method such as CVD, PVD, ALD, the like, or combinations thereof. The dielectric material of CESL 58 may be different (e.g., having a different composition) from gate spacers 46 to provide etching selectivity in subsequent processing, in some embodiments. The dielectric material of CESL 58 may be the same (e.g., having the same or a similar composition) as gate spacers 46 in other embodiments. In some embodiments, CESL 58 is formed having a thickness between about 1 nm and about 10 nm.

ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
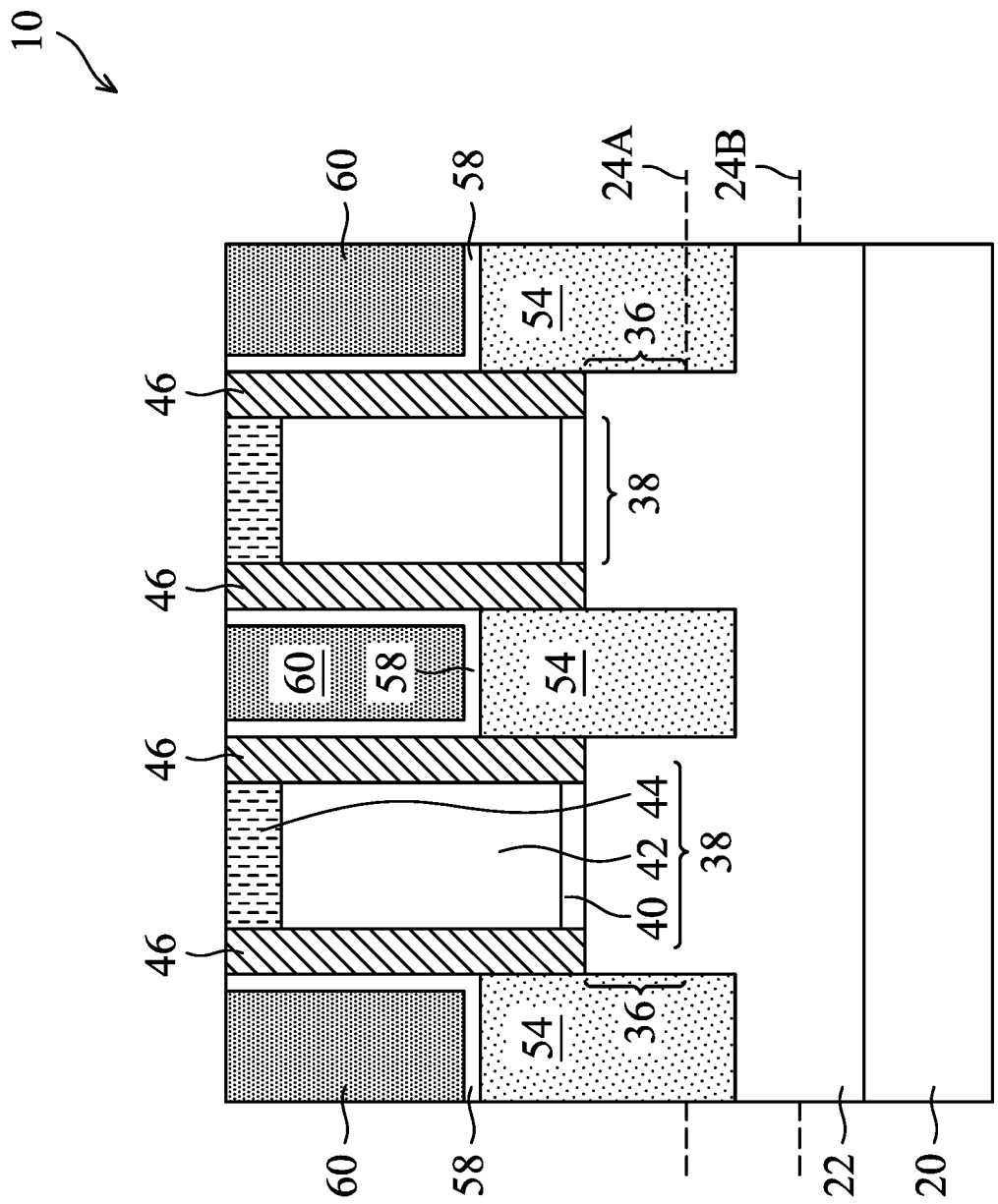
Figure 8:
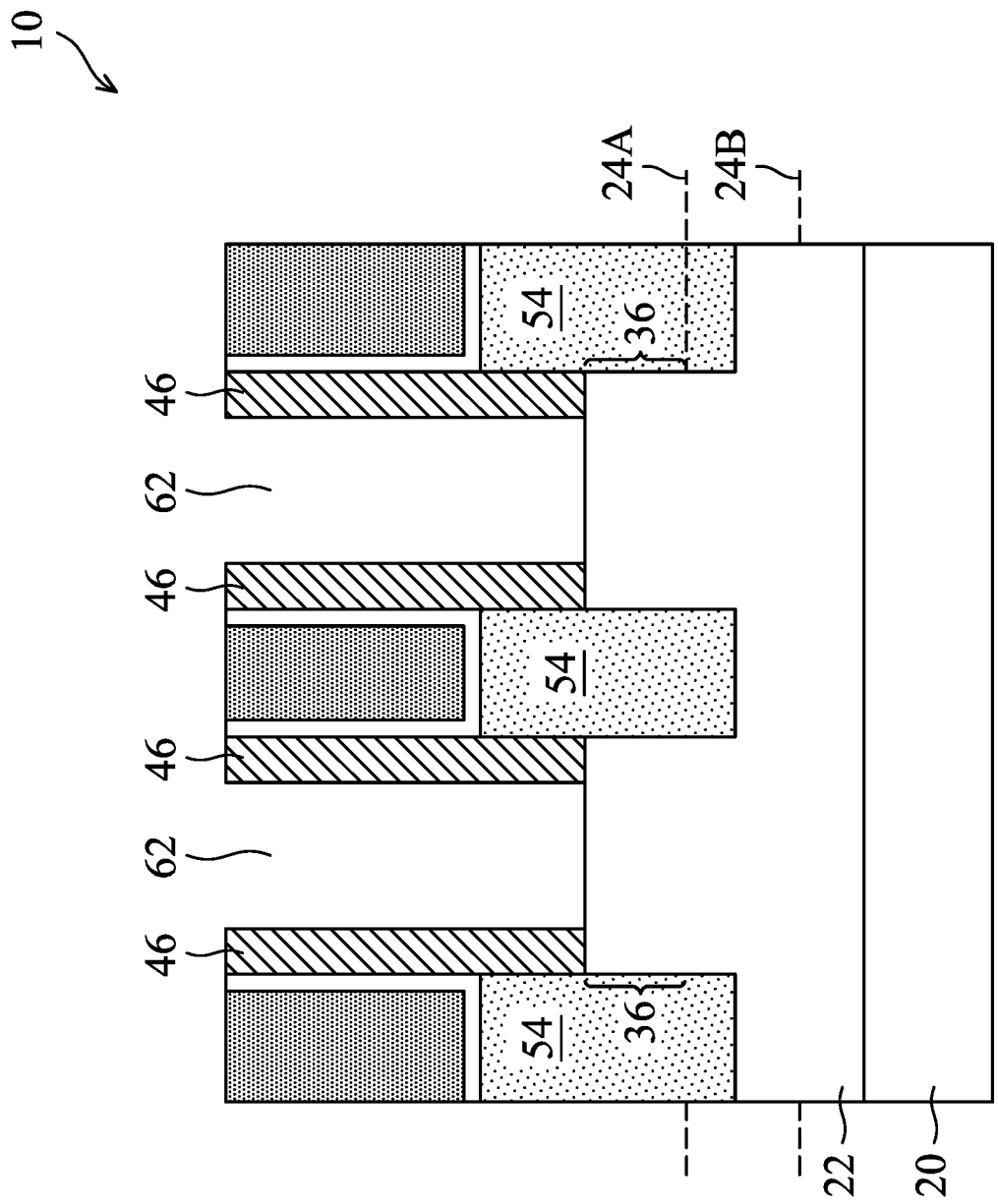

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The top surfaces and the sidewalls of protruding fins 36 are exposed to trenches 62.

Figure 9A:
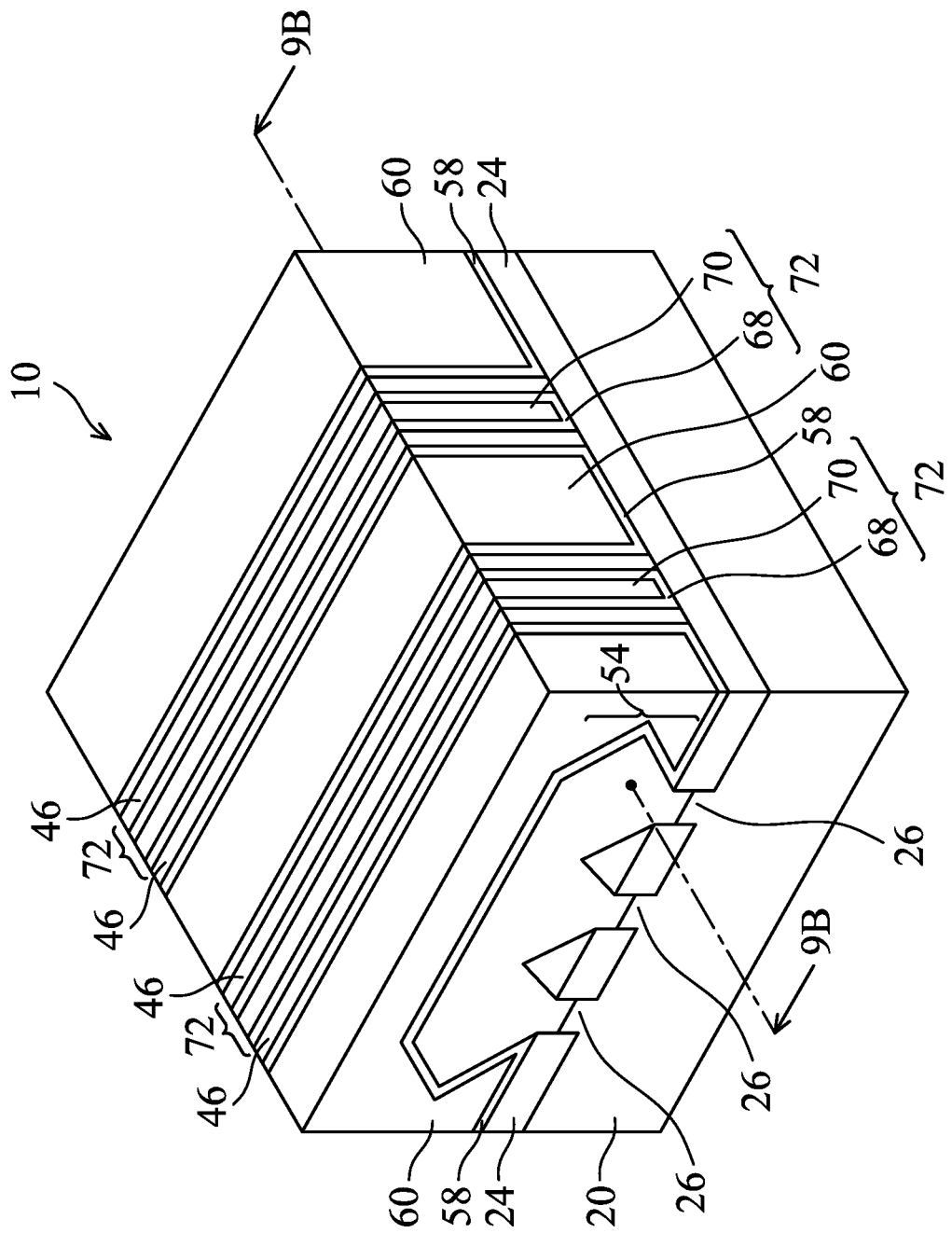
Figure 9B:
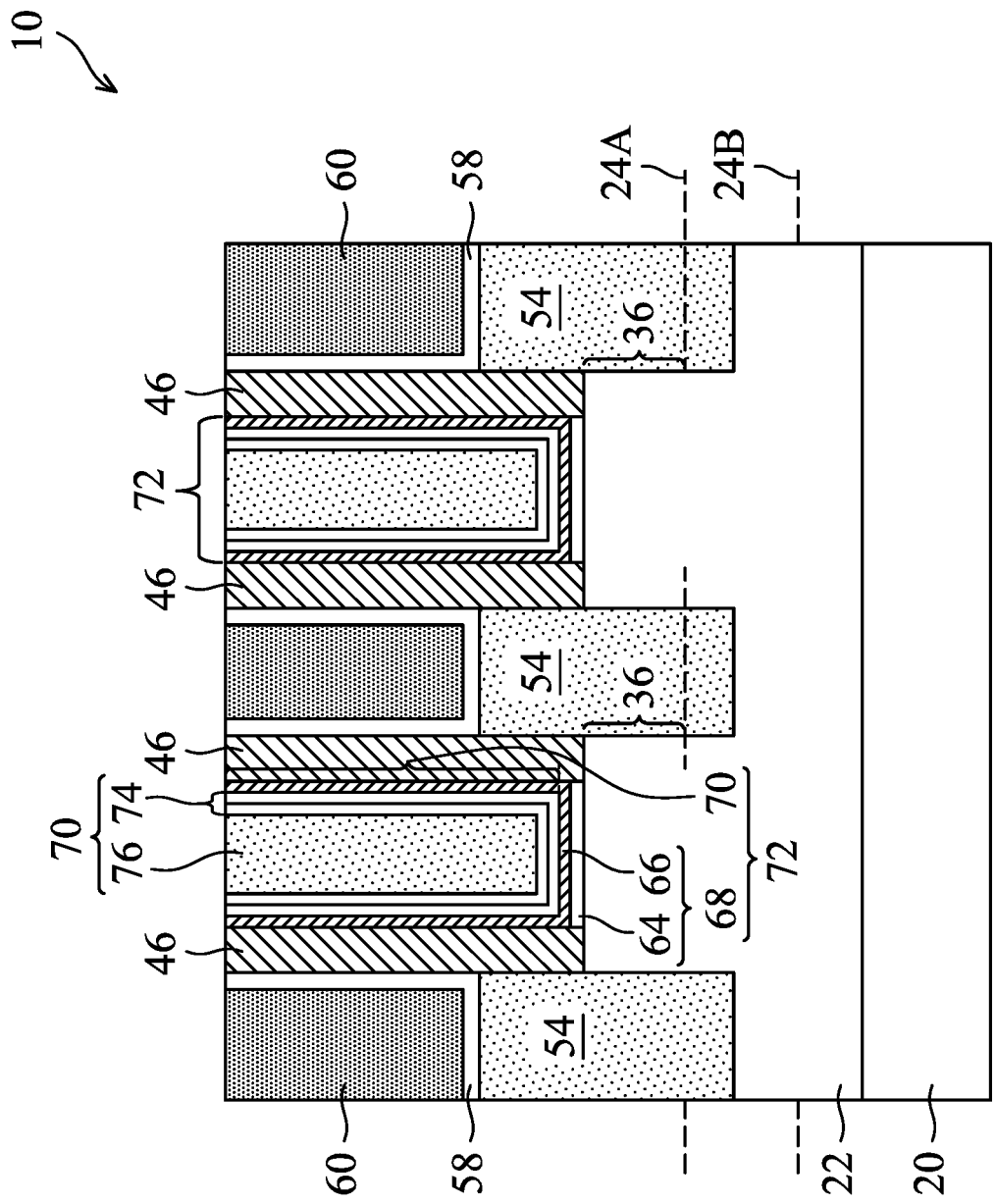

Next, as shown in FIGS. 9A and 9B, replacement gate stacks 72 are formed in trenches 62 (FIG. 8). FIG. 9B illustrates the reference cross-section 9B-9B in FIG. 9A. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64. High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of metal-containing layers 74, which may be formed as conformal layers, and filling-metal regions 76 filling the rest of the trenches unfilled by the plurality of metal-containing layers 74. Metal-containing layers 74 may include a barrier layer, a work-function layer over the barrier layer, and one or a plurality of metal capping layers over the work-function layer.

Figure 10A:
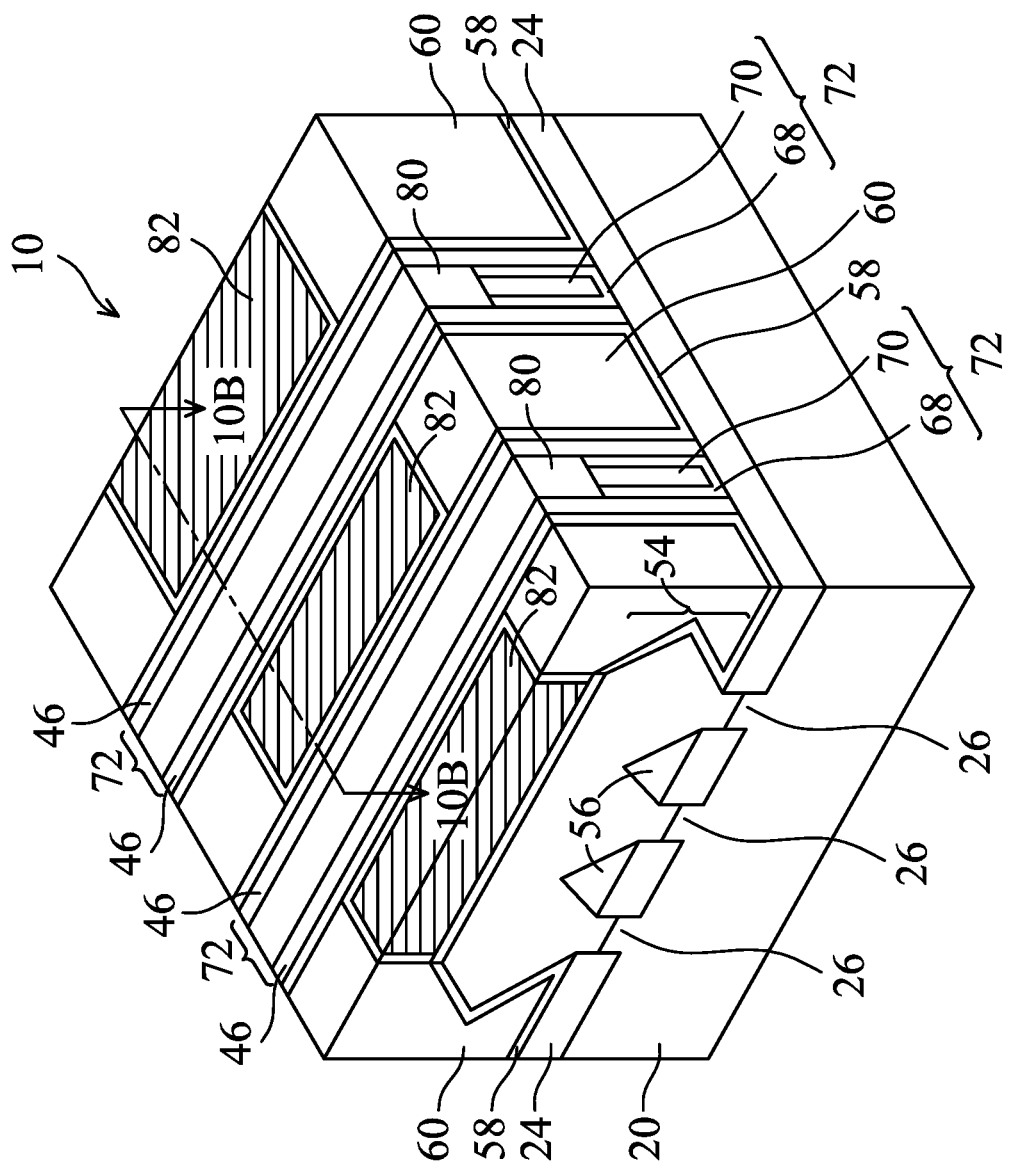
Figure 10B:
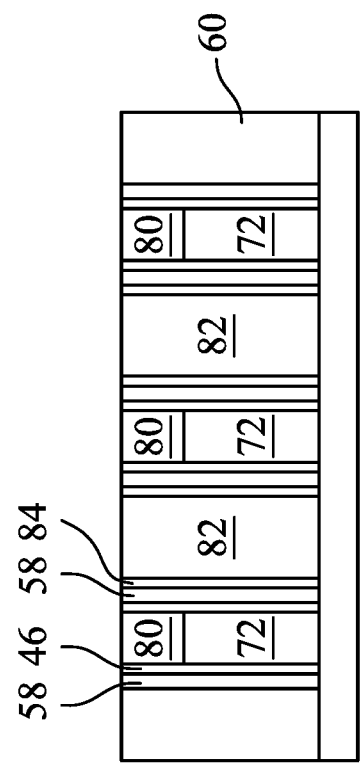

FIGS. 10A and 10B illustrate the formation of dielectric layers 80 and source/drain contact plugs 82, in accordance with some embodiments. FIG. 10B and subsequent figures illustrate a cross-sectional view along the reference cross-section 10B-10B shown in FIG. 10A. For clarity, some details of the structures are not shown in FIG. 10B and subsequent figures. For example, in FIG. 10B and subsequent figures, the details of gate stacks 72 are not shown, and features such as source/drain regions 54, semiconductor fins 36, STI regions 24, and the like are not shown. These and other details may be found referring to FIG. 9B or 10A, for example.

The formation of dielectric layers 80 may include performing an etching process to recess gate stacks 72, so that recesses are formed, filling the recesses with the dielectric material of the dielectric layers 80, and then performing a planarization process such as a CMP process or a mechanical grinding process to remove excess portions of the dielectric material. In some embodiments, gate spacers 46 may also be recessed by the etching process, and dielectric layers 80 may protrude higher than the top surfaces of gate spacers 46 (see, for example, FIG. 21B). Dielectric layers 80 may be formed of a suitable dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, the like, or combinations thereof. Dielectric layers 80 may be formed by a suitable formation method such as CVD, PVD, ALD, the like, or combinations thereof. The dielectric material of dielectric layers 80 may be different (e.g., having a different composition) from gate spacers 46 or CESL 58 to provide etching selectivity in subsequent processing, in some embodiments. The dielectric material of liner 84 may be the same (e.g., having the same or a similar composition) as gate spacers 46 or CESL 58, in some embodiments. Dielectric layers 80 may be formed in a self-aligned manner, and sidewalls of the dielectric layers 80 may be aligned respectively with sidewalls of the gate spacers 46. A planarization process, such as CMP process, may be performed to planarize the upper surface of dielectric layers 80. In some embodiments, dielectric layers 80 may be formed having a thickness between about 1 nm and about 30 nm.

FIGS. 10A and 10B also illustrate the formation of source/drain contact plugs 82. The formation of source/drain contact plugs 82 includes etching ILD 60 to expose the underlying portions of CESL 58, and then etching the exposed portions of CESL 58 to reveal source/drain regions 54. In a subsequent process, a metal layer (such as a Ti layer) is deposited and extending into the contact openings. A metal nitride capping layer may be performed. An anneal process is then performed to react the metal layer with the top portion of source/drain regions 54 to form silicide regions. The previously formed metal nitride layer may be left in place without being removed, or the previously formed metal nitride layer may be removed. A liner 84 may be formed within the contact openings. Liner 84 may be formed by forming a conformal liner layer (e.g., a dielectric layer) over the structure, followed by an anisotropic etch to remove horizontal portions of the liner layer. Liner 84 may be formed of a dielectric material, such as SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, the like, or combinations thereof, in some embodiments. Liner 84 may be formed by a suitable formation method such as CVD, PVD, ALD, the like, or combinations thereof. The dielectric material of liner 84 may be different (e.g., having a different composition) from gate spacers 46, CESL 58, or dielectric layers 80 to provide etching selectivity in subsequent processing, in some embodiments. The dielectric material of liner 84 may be the same (e.g., having the same or a similar composition) as gate spacers 46, CESL 58, or dielectric layers 80 in some embodiments. In some embodiments, liner 84 is formed having a thickness between about 1 nm and about 10 nm. In other embodiments, liner 84 is omitted (see, for example, FIG. 21A).

Next, an electrically conductive material, such as Cu, W, Al, Co, the like, or combinations thereof, is formed in the contact openings, forming source/drain contact plugs 82. Although not illustrated, a barrier layer may be formed conformally along sidewalls and the bottom of the contact openings before the electrically conductive material is formed. The barrier layer may comprise TiN, TaN, Ti, Ta, or the like, and may be formed using, e.g., PECVD, sputtering, MOCVD, ALD, or the like. Next, a planarization process, such as CMP, is performed to achieve a coplanar upper surface between the electrically conductive material, ILD 60, CESL 58, gate spacers 46, and/or liner 84.

Figure 11:
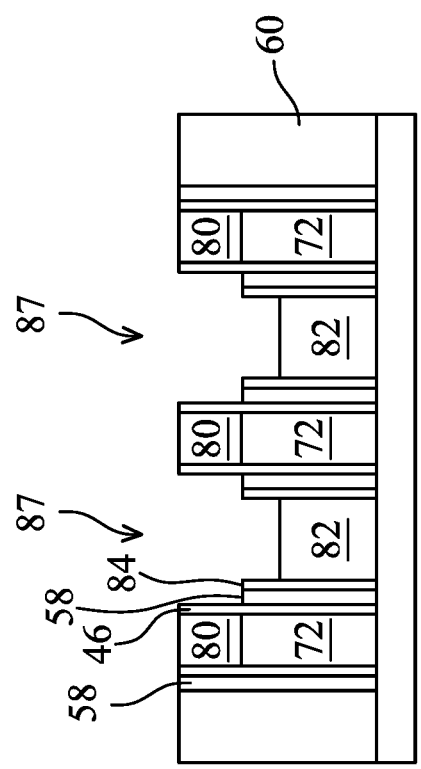

FIG. 11 illustrates the recessing of contact plugs 82, CESL 58, and liner 84 to form recesses 87, in accordance with some embodiments. Upper surfaces of contact plugs 82 may be about level with or recessed below upper surfaces of CESL 58 and/or liner 84, and upper surfaces of CESL 58 and/or liner 84 may be recessed below upper surfaces of gate spacers 46. In some embodiments, upper surfaces of contact plugs 82 may be between about 1 nm and about 50 nm below upper surfaces of CESL 58 and/or liner 84, and upper surfaces of CESL 58 and/or liner 84 may be between about 1 nm and about 50 nm below upper surfaces of gate spacers 46. Liner 84 may be recessed more than CESL 58, in some cases. The recesses 87 may be formed using, for example, one or more anisotropic etching processes. The etching processes may be performed, for example, using one or more etching gases that have a high etching selectivity of the materials of contact plugs 82, CESL 58, and/or liner 84 over the material of gate spacers 46, such that gate spacers 46 are not significantly etched or damaged. In this manner, gate spacers 46 protrude above CESL 58, and the sidewalls of dielectric layers 80 remain covered by gate spacers 46. CESL 58 and/or liner 84 have upper surfaces that are above, below, or about level with upper surfaces of gate stacks 72.

Figure 12:
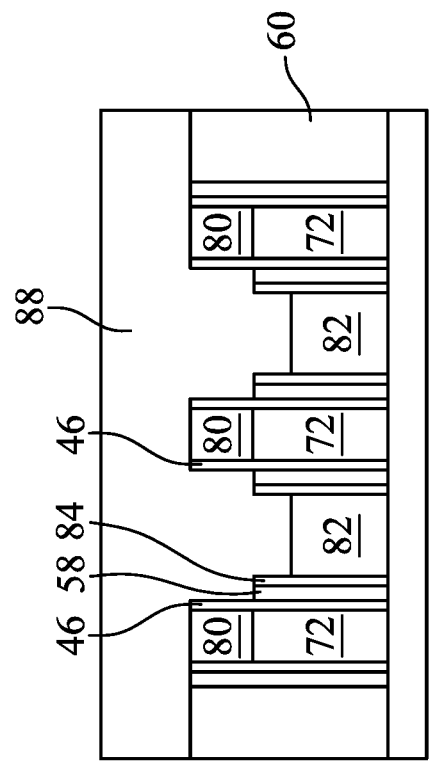

Turning to FIG. 12, the recesses 87 are filled with a first mask material 88, in accordance with some embodiments. First mask material 88 may comprise a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, the like, or combinations thereof. First mask material 88 may be formed by a suitable formation method such as CVD, PVD, ALD, the like, or combinations thereof. The dielectric material of first mask material 88 may be different (e.g., having a different composition) from gate spacers 46 or CESL 58 to provide etching selectivity in subsequent processing, in some embodiments. The dielectric material of first mask material 88 may be different (e.g., having a different composition) from gate spacers 46, CESL 58, liner 84, and/or dielectric layers 80 to provide etching selectivity in subsequent processing, in some embodiments. For example, first mask material 88 may be a dielectric material that can be selectively etched over the materials of gate spacers 46, CESL 58, liner 84, and dielectric layers 80 when forming recesses 95 (see FIGS. 17A-C). A planarization process, such as CMP process, may be subsequently performed to remove excess first mask material 88.

Figure 13:
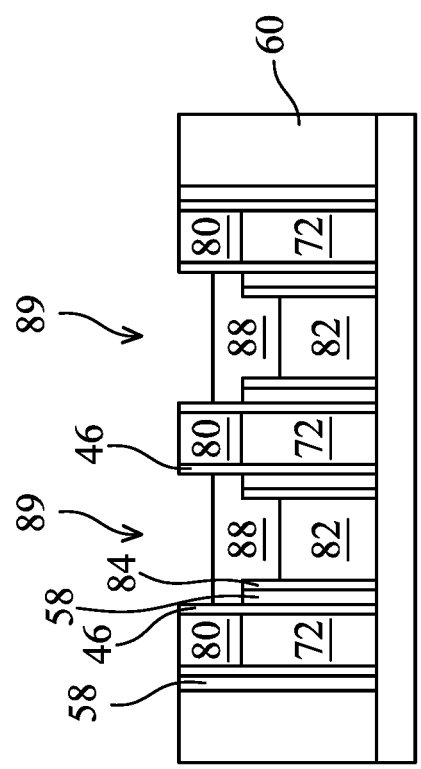

In FIG. 13, first mask material 88 is recessed to form recesses 89, the remaining portions of first mask material 88 forming first mask layers 88, in accordance with some embodiments. First mask material 88 may be etched, for example, in an etch-back process using an anisotropic etch. The anisotropic etch may have a high selectivity to first mask material 88 over the materials of gate spacers 46, CESL 58, and dielectric layers 80. For example, a ratio of the etching rate of first mask material 88 to the etching rate of the other materials may be about 5:1 or greater. In some embodiments, a thickness D1 (see FIG. 15A) of the portions of first mask layers 88 over the contact plug 82 may be between about 2 nm and about 100 nm, and a thickness D2 (see FIG. 15A) of the portions of first mask layers 88 over the CESL 58 and/or liner 84 may be between about 1 nm and about 50 nm. In this manner, first mask layers 88 have lower sidewalls along liner 84 and upper sidewalls along gate spacers 46. As shown in FIG. 13, an upper portion of first mask layer 88 has an upper width that is greater than a lower width of a lower portion of first mask layer 88.

Figure 14:
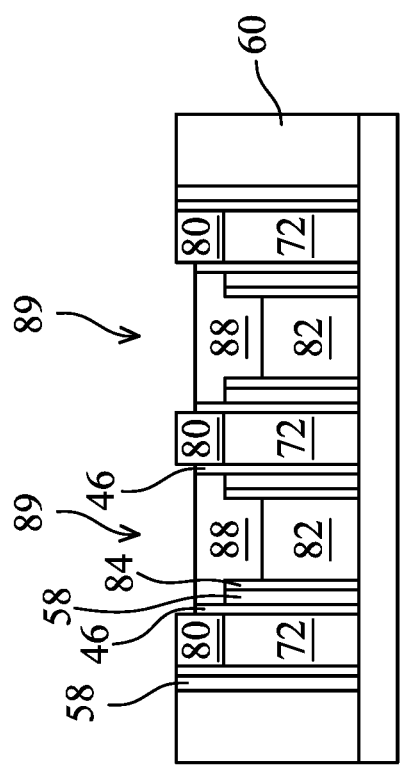

In FIG. 14, gate spacers 46 are recessed to expose sidewalls of dielectric layers 80, in accordance with some embodiments. Gate spacers 46 may be recessed, for example, using an anisotropic etch having a high selectivity to the material of gate spacers 46 over the materials of CESL 58, dielectric layers 80, and first mask layers 88. For example, a ratio of the etching rate of gate spacers 46 to the etching rate of the other materials may be about 5:1 or greater. Gate spacers 46 may be recessed such that upper surfaces of gate spacers 46 are about level with or protrude above upper surfaces of first mask layers 88. In some embodiments, gate spacers 46 may protrude between about 0 nm and about 50 nm above upper surfaces of first mask layers 88. In this manner, gate spacers 46 protrude above CESL 58 and liner 84, and extend fully along upper sidewalls of first mask layers 88. In some embodiments, gate spacers 46 protrude above upper surfaces of gate stacks 72. In other embodiments, gate spacers 46 are not recessed.

In FIGS. 15A, 15B, 15C, and 15D, the recesses 89 are filled with a second mask material to form second mask layers 90, in accordance with some embodiments. FIGS. 15A through 15D each show various cross-sectional views of forming second mask layers 90 in accordance with different embodiments. Second mask layers 90 may comprise a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, the like, or combinations thereof. Second mask layers 90 may be formed by a suitable formation method such as CVD, PVD, ALD, the like, or combinations thereof. The dielectric material of second mask layers 90 is different (e.g., having a different composition) from the first dielectric material 88 to provide etching selectivity in subsequent processing. For example, the second mask layers 90 may be a dielectric material that can be selectively etched over the materials of gate spacers 46 and dielectric layers 80 when forming recesses 95 (see FIGS. 17A-C). The second mask layers 90 may also be a dielectric material such that dielectric layers 80 can be selectively etched over second mask layers 90 when forming openings 97 (see FIG. 18). A planarization process, such as a CMP process, may be subsequently performed to remove excess material of second mask layers 90, which may planarize upper surfaces of second mask layers 90 and dielectric layers 80. As shown in FIG. 15, second mask layer 90 extends over gate spacers 46, and thus second mask layer 90 has a greater width than first mask layer 88. In some embodiments, second mask layers 90 may have a thickness over first mask layers 88 that is between about 1 nm and about 50 nm. In some cases, a ratio of the thickness of a second mask layer 90 to a thickness of a first mask layer 88 may be between about 1:2 and about 1:200. In some cases, a relatively smaller thickness of second mask layer 90 may allow for easier or more reproducible etching of second mask layer 90 during formation of openings 95 (see FIGS. 17A-C), which can reduce the chance of undesirable exposing of gate stacks 72.

Figure 15A:
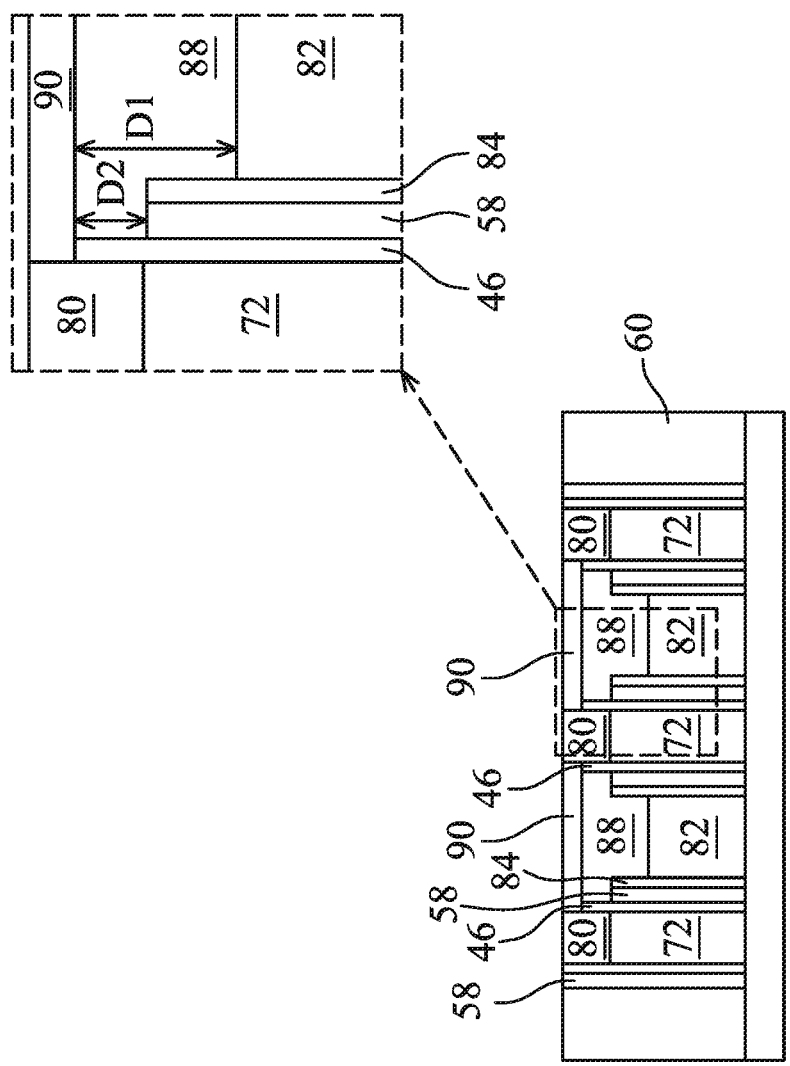
Figure 15D:
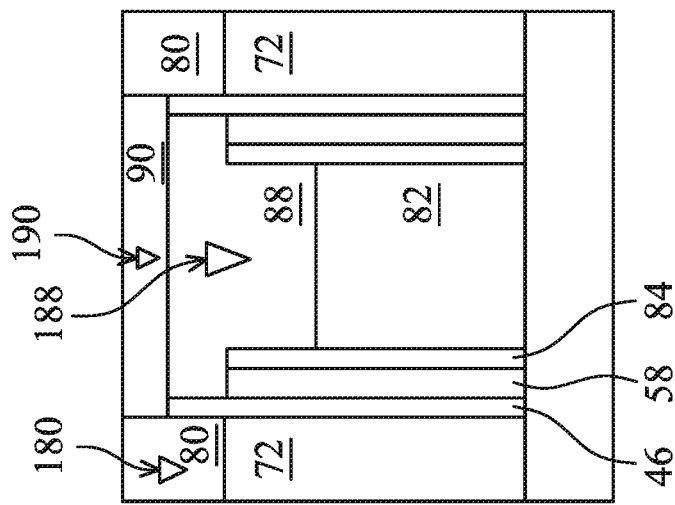
Figure 15C:
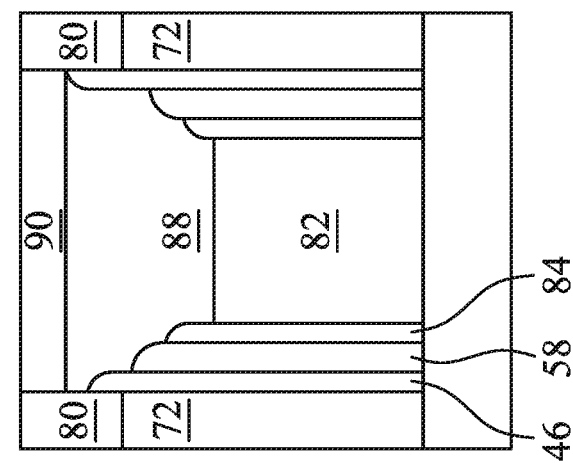
Figure 15B:
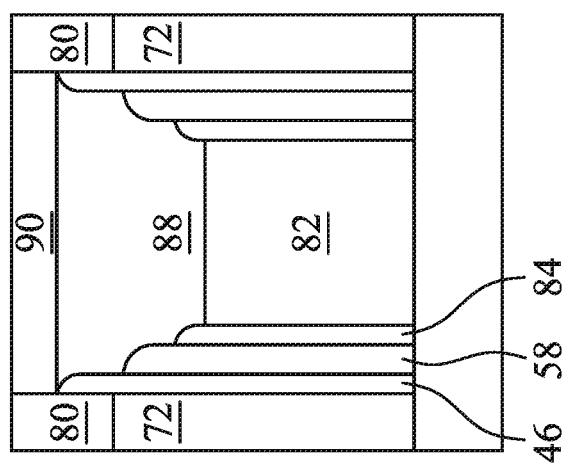

FIGS. 15B, 15C, and 15D illustrate various cross-sectional views of a region of the structure shown in FIG. 15A, in accordance with some embodiments. The structures shown in FIGS. 15B-D are illustrative examples of variations of the structure shown in FIG. 15A, and the different features shown in FIGS. 15B-D may be present in any combination, or not at all. The variations shown in FIGS. 15B-D may be due to, for example, process nonuniformity or other factors. FIG. 15B illustrates a structure in which the upper surfaces of gate spacers 46, CESL 58, and/or liner 84 are not flat but rounded. None, some, or all of gate spacers 46, CESL 58, and liner 84 may have rounded upper surfaces. The rounded upper surfaces of gate spacers 46, CESL 58, and/or liner 84 may be formed by previously performed etching processes, such as those described above for FIGS. 11 and 14. The rounded upper surfaces of gate spacers 46, CESL 58, and/or liner 84 may extend a vertical distance that is between about 0.1 nm and about 15 nm, in some embodiments.

FIG. 15C illustrates a structure in which different regions of gate spacers 46, CESL 58, and/or liners 84 protrude different heights (e.g., above the contact plug 82). For example, a gate spacer 46, CESL 58, and/or liner 84 disposed on one side of a contact plug 82 may have a different height than the corresponding gate spacer 46, CESL 58, and/or liner 84 disposed on the opposite side of the contact plug 82. For example, different gate spacers 46, CESL 58, and/or liners 84 may have heights that differ between about 0.1 nm and about 20 nm.

FIG. 15D illustrates a structure in which dielectric layers 80, first mask layers 88, and/or second mask layers 90 include voids. For example, a dielectric layer 80 may include a void 180, a first mask layer 88 may include a void 188, and/or a second mask layer 90 may include a void 190. The voids 180/188/190 may be due to, for example, incomplete filling of the associated recess during deposition of the associated dielectric material. In some embodiments, a void within a material may be formed a vertical distance from the bottom of the material that is between about 0.1 nm and about 30 nm, which may depend on the thickness of the material. A void may have extend vertically a distance between about 0.1 nm and about 30 nm, and may extend laterally a distance between about 0.1 nm and about 30 nm.

Figure 16:
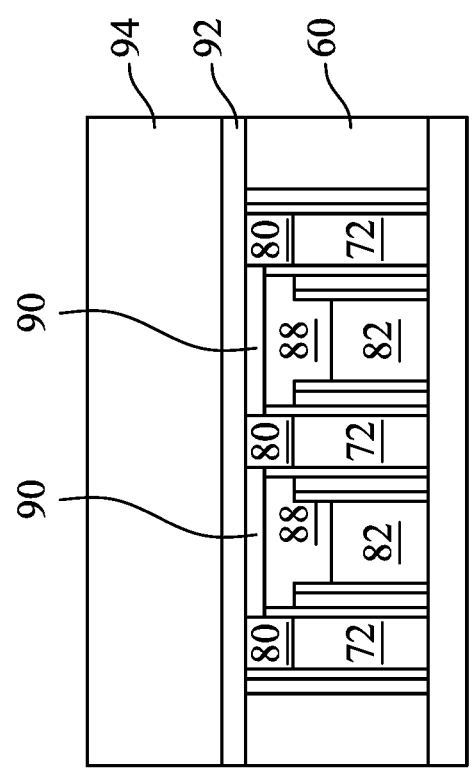
Figure 17A:
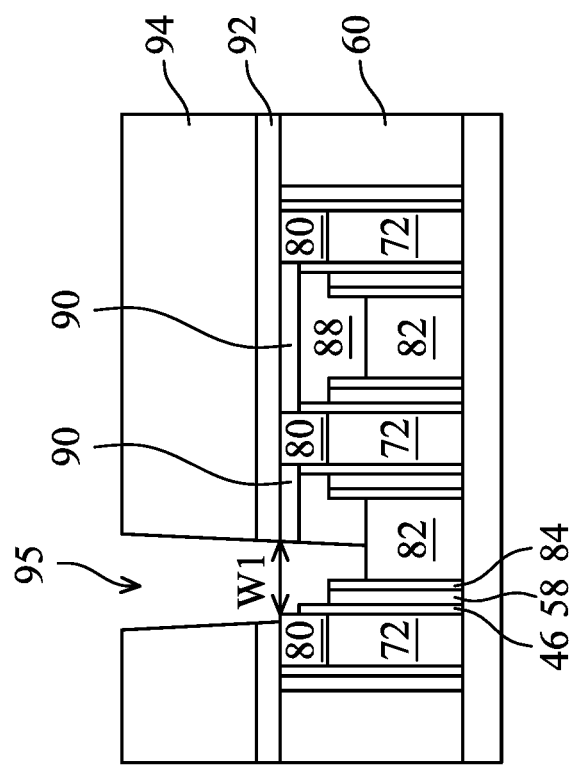
Figure 18:
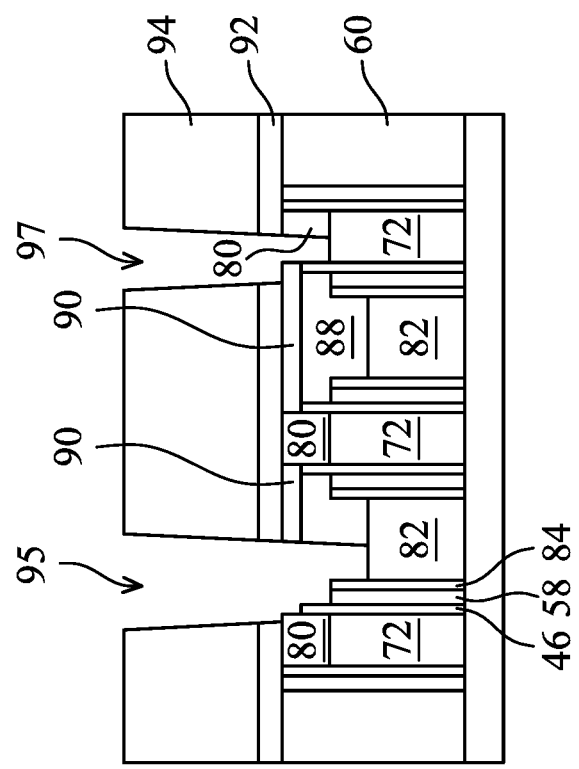

FIG. 16 illustrates the formation of etch stop layer 92 and hard mask 94, which are used for forming and preserving the patterns of source/drain contact openings 95 (see FIGS. 17A-C) and gate contact openings 97 (see FIG. 18). The structure shown in FIG. 16 is formed from the structure shown in FIG. 15A, though the processing steps described are also applicable to the structures shown in FIG. 15B-D or similar structures. Etch stop layer 92 may comprise a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, the like, or combinations thereof. Etch stop layer 92 may be formed by a suitable formation method such as CVD, PVD, ALD, the like, or combinations thereof. Etch stop layer 92 may be formed having a thickness between about 1 nm and about 60 nm, in some embodiments. In other embodiments, etch stop layer 92 is not formed. In other embodiments, neither etch stop layer 92 nor hard mask 94 are formed, and thus openings 95 and openings 97 (see FIGS. 17A-C and 18) are formed without the use of etch stop layer 92 or hard mask 94.

Hard mask 94 may comprise a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, SiO, BN, the like, or combinations thereof. Hard mask 94 may be formed by a suitable formation method such as CVD, PVD, ALD, the like, or combinations thereof. The dielectric material of hard mask 94 is different (e.g., having a different composition) from hard mask 94 to provide etching selectivity in subsequent processing. Hard mask 94 may be formed having a thickness between about 1 nm and about 60 nm, in some embodiments, which may be thicker than that of etch stop layer 92.

Next, as shown in FIGS. 17A, 17B, and 17C, source/drain contact openings 95 are formed to expose source/drain contact plugs 82. FIGS. 17A, 17B, and 17C show examples contact openings 95 of different widths (e.g., W1, W2, and W3) that may be formed, in accordance with some embodiments. In some embodiments, a photoresist (not shown) is formed over hard mask 94 and patterned, and then hard mask 94 and etch stop layer 92 are etched using the patterned photo resist as an etching mask. Portions of hard mask 94 and etch stop layer 92 may be etched in this manner so that openings 95 are formed in hard mask 94 and etch stop layer 92 that expose second mask layer 90. Next, second mask layer 90 and first mask layer 88 are etched to extend openings 95 through first mask layer 88 and expose contact plug 96.

First mask layer 88 and second mask layer 90 may be etched using a single etching process or two separate etching processes. The one or more etching processes may include, for example, anisotropic etching processes. The anisotropic etching processes may have a high selectivity to the material of first mask layer 88 and/or the material of second mask layer 90 over the materials of gate spacers 46, CESL 58, and dielectric layers 80. For example, second mask layer 90 may be etched using an etching process that is selective to the material of second mask layer 90 over the material of dielectric layer 80. First mask layer 88 may be etching using an etching process that is selective to the material of first mask layer 88 over the material of gate spacers 46, CESL 58, and liner 84. A single etching process may have suitable selectivities such that first mask layer 88 and second mask layer 90 are etched in this manner using the same etching process.

As a result of the selective etching of first mask layer 88 and second mask layer 90 as described herein, dielectric layer 80, gate spacer 46, CESL 58, and liner 84 are not etched when forming contact openings 95, as shown in FIG. 17A. As shown in FIGS. 17A-C, dielectric layers 80 and gate spacers 46 protect gate stacks 72 from the etching of contact openings 95. In this manner, gate stacks 72 are not likely to be exposed by the etching of openings 95, reducing the chance of undesired electrical shorting or leakage between the gate stacks 72 and source/drain contact plugs 96 (see FIG. 19). For example, FIG. 17A illustrates an example case in which a photolithographic overlay shift causes some of contact opening 95 to extend over dielectric layer 80. In FIG. 17A, an overlay shift has shifted the contact opening 95 away from having an approximately centered alignment with contact plug 82. The example overlay shift as shown also causes contact opening 95 to incompletely expose upper surfaces of the contact plug 82. The use of materials and etching processes that allow selective etching of contact openings 95 as described herein can prevent exposure of gate stacks 72 even when a significant overlay shift is present. Thus, device failures due to undesirable exposing of gate stacks 72 may be avoided, and yield may be improved.

The use of materials and selective etching as described herein can allow for contact openings 95 to be formed having larger widths without increasing the risk of device failures due to shorts or leakage. Contact openings 95 may be formed having a width (e.g., W1, W2, or W3) that is between about 2 nm and about 30 nm, in some embodiments. Larger widths are possible. FIG. 17A illustrates a contact opening 95 having a width W1 that is about the same as the width of the corresponding contact plug 82. As shown in FIG. 17A, an overlay shift may reduce the area of contact plug 82 that is exposed by contact opening 95, which may reduce the contact area between the contact plug 82 and a subsequently formed contact plug 96 (see FIG. 19). In some cases, a reduced contact area can result in an increased contact resistance, which can adversely affect device efficiency and speed.

In some embodiments, a contact opening 95 may be formed having a width that is larger than the width of contact plug 82, such that the majority of the area of contact plug 82 is exposed even when an overlay shift is present. As an example, FIG. 17B illustrates a contact opening 95 having a width W2 that is larger than the width of contact plug 82. In the example shown in FIG. 17B, contact opening 95 has an overlay shift that exposes dielectric layer 80. The larger width of contact opening 95 allows most of contact plug 82 to be exposed despite the overlay shift. This can reduce the effect of an overlay shift on the contact area between contact plug 82 and contact plug 96 (see FIG. 19), which can reduce the effect on device performance due to an overlay shift. In this manner, device performance and uniformity can be improved under process variations. Additionally, the materials, selective etching processes, and other techniques described herein can allow for a larger width of contact opening 95 with less risk of exposing gate stack 72 during etching.

FIG. 17C illustrates an example in which the width W3 of contact opening 95 is large enough to expose neighboring dielectric layers 80. Contact opening 95 shown in FIG. 17C may be, for example, an elongated or "slot" opening used to form large contact plugs 96 (see FIG. 19). As shown in FIG. 17C, the width W3 is large enough that the full area of upper surfaces of contact plug 82 are exposed by contact opening 95 even when a large overlay shift is present. As shown in FIGS. 17A-C, the techniques described herein allow for contact openings 95 having large widths to be formed without exposing gate stacks 72. Contact openings 95 may have larger widths than shown in FIGS. 17A-C, such as, for example, having a width large enough to expose two or more adjacent contact plugs 82. In some cases, the reduced risk of exposing gate stacks 72 allows for devices of smaller size to be formed. For example, the dimensions of contact plugs 82, gate stacks 72, or other features (e.g., those shown in FIGS. 9A-B or other features) may be reduced to smaller sizes without being limited by a smallest achievable width of contact openings 95, due to a risk of relatively large contact openings 95 exposing gate stacks 72. In this manner, the materials, selective etching processes, and other techniques described herein can allow for smaller feature sizes, which can allow for smaller device dimensions or greater device density. Additionally, the protrusion of the gate spacers 46 provide improved isolation between the gate stacks 72 and the source/drain contact plugs 96 (see FIG. 19), which can allow for the formation of larger source/drain contact plugs 96 (e.g., using a "slot" process or the like).

Next, as shown in FIG. 18, gate contact openings 97 are formed to expose gate stacks 72. In some embodiments, a photoresist (not shown) is formed over hard mask 94 and patterned, and then hard mask 94 and etch stop layer 92 are etched using the patterned photo resist as an etching mask. Portions of hard mask 94 and etch stop layer 92 may be etched in this manner so that openings 97 are formed in hard mask 94 and etch stop layer 92 that expose first mask layer 88. Next, dielectric layer 80 is etched to extend openings 97 through dielectric layer 80 and expose gate stack 72.

Dielectric layer 80 may be etched using, for example, an anisotropic etching process. The anisotropic etching process may have a high selectivity to the material of dielectric layer 80 over the materials of gate spacers 46 and second mask layer 90. As such, the etching process used to etch dielectric layer 80 to expose gate stacks 72 is different from the etching process used to etch second mask layer 90 (and, in some embodiments, first mask layer 88 also) to expose contact plugs 82. By using an etching process that is selective to dielectric layer 80 over second mask layer 90 and gate spacers 46, contact openings 97 may be formed with less risk of undesired etching of other regions. For example, FIG. 18 illustrates an example case of overlay shift in which the gate contact opening 97 extends over second mask layer 90. By using a selective etching process as described, only the dielectric layer 80 is significantly etched.

By covering contact plugs 82 with first mask layer 88 and second mask layer 90 that are formed from different materials, differently selective etching processes can be used for forming the source/drain contact openings 95 and the gate contact openings 97. This can allow for greater flexibility of design and allow for smaller feature sizes, with less risk of undesired etching during formation of source/drain contact openings 95 and gate contact openings 97. For example, the use of both first mask layer 88 and second mask layer 90 over contact plugs 82 can allow for more choices of materials and/or etching processes that fulfill selectivity process constraints for forming contact openings 95/97.

Figure 19:
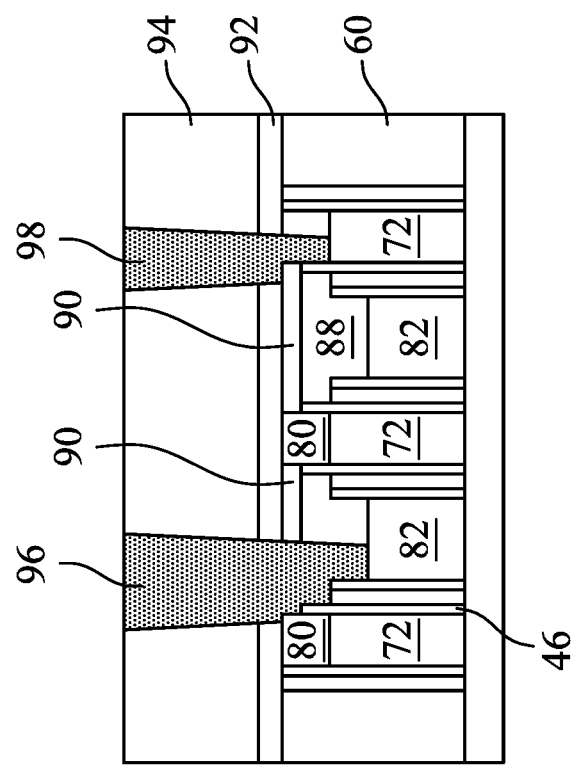

Next, in FIG. 19, source/drain contact plugs 96 are formed in openings 95 and gate contact plugs 98 are formed in openings 97, in accordance with some embodiments. Source/drain contact plugs 96 and gate contact plugs 95 may be formed using the same process steps. For example, contact plugs 96 and contact plugs 98 may be formed by filling openings 95 and openings 97 with conductive material. The conductive material may include a diffusion barrier layer, which may be formed of titanium nitride, tantalum nitride, titanium, tantalum, or the like, and a conductive filling material such as copper, tungsten, cobalt, aluminum, ruthenium, the like, or combinations thereof. The conductive material may be formed over upper surfaces of hard mask 94.

Figure 20:
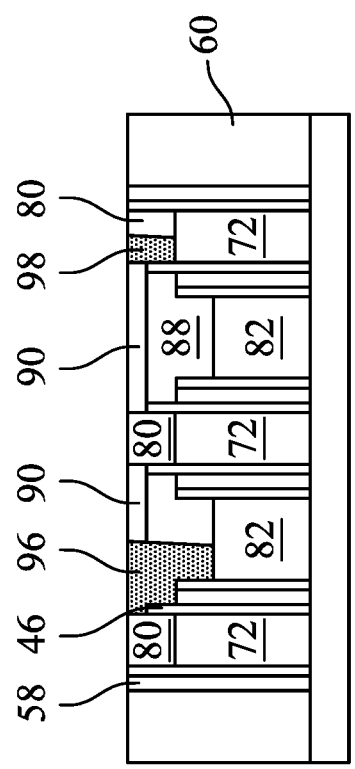

As shown in FIG. 19, gate spacers 46 separate gate stacks 72 from the conductive material of contact plugs 96. Gate spacers 46 protrude higher than gate stacks 72, providing a larger separation distance between gate stacks 72 and contact plugs 96 and protecting more of the sidewalls of gate stacks 72 from damage or processing defects. For example, protrusion of gate spacers 46 as described can reduce the chance of the conductive material of contact plugs 96 forming an electrical short to gate stacks 72 than if gate spacers 46 had a height closer to that of gate stacks 72. Additionally, the protrusion of gate spacers 46 can allow for a larger separation distance between gate stacks 72 and contact plugs 96, which reduces the chance of leakage between gate stacks 72 and contact plugs 96. A larger separation distance may also reduce the risk or severity of time-dependent dielectric breakdown (TBBD). In some embodiments, due to the protrusion of gate spacers 46, a minimum separation distance between a gate stack 72 and a contact plug 96 is between about 2 nm and about 12 nm. In FIG. 20, excess material of contact plugs 96 and contact plugs 98 are removed using a planarization process (e.g., a CMP process and/or a grinding process) and/or an etching process. As shown in FIG. 20, etch stop layer 92 and hard mask 94 may also be removed.

As feature sizes continue to shrink in advanced processing nodes, the resolution of the conventional photolithography may not be enough to form separate opening for each of the contact plugs 96 and/or contact plugs 98. The disclosed methods allows larger openings 95 and/or larger openings 97 to be formed using the conventional photolithography, and contact plugs 96 and/or contact plugs 98 to be formed in a self-aligned manner. This can help to reduce the manufacturing cost (e.g., less stringent requirement for the photolithography tool), and can also improve production yields (e.g., self-aligned gate contacts are easier to form and less likely to have issues associated with filling high aspect ratio openings).

Figure 21A:
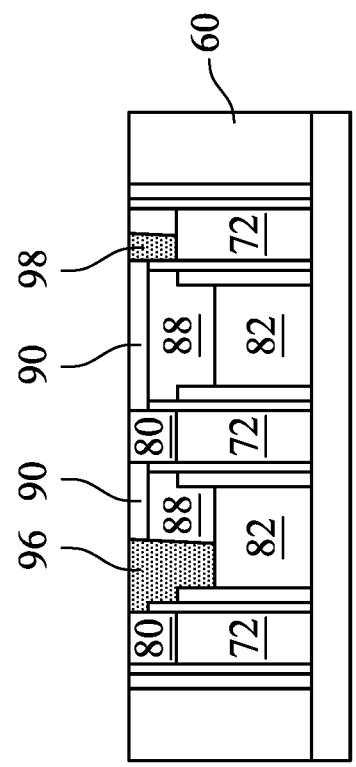
Figure 21B:
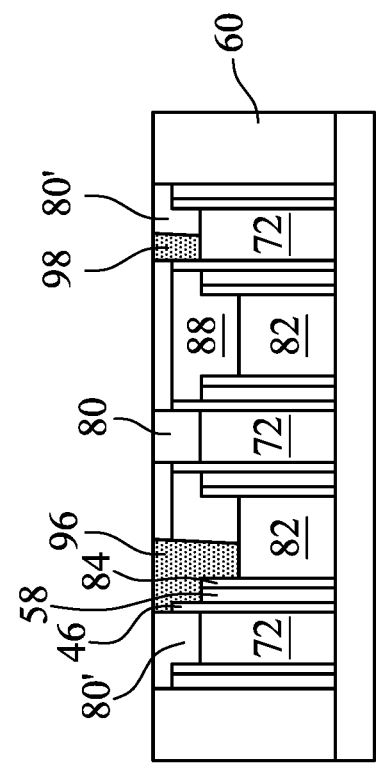

FIGS. 21A and 21B illustrate various cross-sectional views of the structure shown in FIG. 20, in accordance with some embodiments. The structures shown in FIGS. 21A-B are illustrative examples of variations of the structure shown in FIG. 20, and the different features shown in FIGS. 21A-B may be present in any combination, or not at all. FIG. 21A shows an embodiment in which the liner 84 is omitted. The process steps used to form the structure shown in FIG. 21A may be similar to the process steps described herein for forming the structure shown in FIG. 20. The omission of liner 84 may allow for more flexibility of material and selective etching when forming openings 95 and openings 97, for instance.

FIG. 21B shows an embodiment in which CESL 58 and gate spacers 46 adjacent ILD 60 are recessed, and dielectric layers 80 are formed extending over these recessed CESL 58 and gate spacers 46. The dielectric layers 80 adjacent ILD 60 that have portions extending over CESL 58 and gate spacers 46 are indicated in FIG. 21B as dielectric layers 80'. The CESL 58 and gate spacers 46 may be recessed, for example, as part of one or more process steps described above, such as that described for FIG. 14. By recessing the CESL 58 and gate spacers 46 adjacent ILD 60, the openings 95 and/or openings 97 adjacent ILD 60 may be formed having a wider profile, which can improve the gap-filling of the conductive material during the formation of contact plugs 96 and/or contact plugs 98.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are formed by patterning a stack of alternating layers of channel layers and sacrificial layers. The dummy gate stacks and epitaxial source/drain regions may be formed in a similar manner as described above. After the dummy gate stacks are removed, the sacrificial layers can be partially or fully removed in the channel regions. The replacement gate structures may be formed in a similar manner as described above and will partially or completely surround the channel layers in the channel region of the NSFET devices. The ILDs and contacts to the gate structures and source/drain regions may be formed in a similar manner as described above. A nanostructure device can be formed as disclosed in U.S. Patent Application Publication 2016/0365414, which is incorporated herein by reference in its entirety.

The embodiments of the present disclosure have some advantageous features. With the reduction of the feature sizes in integrated circuits, the sizes of source/drain contact plugs and gate contact plugs are reduced. It becomes harder to form the contact plugs with small sizes, for example, due to the limitation of the photolithography processes. To overcome this limitation, two protective layers of different dielectric materials are formed over the source/drain contacts, so that different selective etches may be used when forming openings for subsequent source/drain contact plugs and gate contact plugs. For example, etches may be used that are selective to each of the materials of the protective layers as well as other layers within the structure. This can improve process flexibility and reduce unwanted etching when forming contact openings. Using the techniques described herein, larger contacts may be formed without increasing the risk of unwanted etching. Additionally, gate spacer layers are formed that protrude higher than the gate stacks. This reduces the chance of the gate stacks being undesirably etched and also provides improved separation between the source/drain contact plugs and the gate stacks, which can reduce leakage.

In accordance with some embodiments of the present disclosure, a device including a fin protruding from a semiconductor substrate, a gate structure over the fin, a first dielectric layer including a first dielectric material on the gate structure, a gate spacer layer along a sidewall of the gate structure and a sidewall of the first dielectric layer, wherein an upper surface of the gate spacer layer is farther from the semiconductor substrate than an upper surface of the gate structure, an etch stop layer along the gate spacer layer, wherein an upper surface of the etch stop layer is closer to the semiconductor substrate than an upper surface of the gate spacer layer, a source/drain contact adjacent the etch stop layer, a second dielectric layer including a second dielectric material on the source/drain contact, wherein the second dielectric layer extends over the upper surface of the etch stop layer, and a third dielectric layer including a third dielectric material on the second dielectric layer, wherein the third dielectric material has a different composition than the second dielectric material, wherein the third dielectric layer extends over the upper surface of the gate spacer layer. In an embodiment, the device includes a source/drain contact plug extending through the second dielectric layer and the third dielectric layer, the source/drain contact plug physically contacting the source/drain contact. In an embodiment, a width of the source/drain contact plug is greater than a width of the source/drain contact. In an embodiment, the source/drain contact plug physically contacts a sidewall of the first dielectric layer and a sidewall of the gate spacer layer. In an embodiment, the device includes a gate contact plug extending through the first dielectric layer to physically contact the gate structure, wherein the gate contact plug physically contacts the gate spacer layer and the third dielectric layer. In an embodiment, the device includes a liner layer along the etch stop layer, wherein an upper surface of the liner layer is farther from the semiconductor substrate than an upper surface of the source/drain contact. In an embodiment, a width of the third dielectric layer is greater than a width of the second dielectric layer. In an embodiment, an upper width of the second dielectric layer is greater than a lower width of the second dielectric layer. In an embodiment, the upper surface of the gate spacer layer is farther from the semiconductor substrate than the upper surface of the gate structure by a distance in the range of 1 nm and 30 nm.

In accordance with some embodiments of the present disclosure, a semiconductor device includes a gate stack, a first dielectric material over the gate stack, a gate spacer on a sidewall of the gate stack and on a sidewall of the first dielectric material, an etch stop layer on a sidewall of the gate spacer opposite the gate stack, a source/drain contact adjacent the etch stop layer, a second dielectric material over the source/drain contact and over the etch stop layer, the second dielectric material physically contacting the sidewall of the gate spacer, a third dielectric material over the second dielectric material and over the gate spacer, the third dielectric material physically contacting a sidewall of the first dielectric material, a gate contact extending through the first dielectric material and physically contacting the gate stack and the gate spacer, and a source/drain contact plug extending through the second dielectric material and through the third dielectric material and physically contacting the source/drain contact and the sidewall of the gate spacer, the source/drain contact plug extending over the etch stop layer and over the gate spacer. In an embodiment, the gate contact physically contacts a sidewall of the third dielectric material. In an embodiment, the source/drain contact plug has the same width as the third dielectric layer. In an embodiment, the semiconductor device includes a liner layer extending between the etch stop layer and the source/drain contact. In an embodiment, the third dielectric material is a different dielectric material than the second dielectric material. In an embodiment, the third dielectric material is a different dielectric material than the first dielectric material. In an embodiment, the gate spacer includes a fourth dielectric material, and wherein the second dielectric material is a different dielectric material than the fourth dielectric material.

In accordance with some embodiments of the present disclosure, a method includes forming a dummy gate structure over a fin, the fin protruding above a substrate, forming a gate spacer layer on sidewalls of the dummy gate structure, forming an etch stop layer on sidewalls of the gate spacer layer, replacing the dummy gate structure with a gate stack, forming a source/drain contact adjacent the etch stop layer, recessing the gate stack to form a first recess, filling the first recess with a first dielectric material having a first composition, recessing the source/drain contact and the etch stop layer to form a second recess, filling the second recess with a second dielectric material having a second composition, recessing the second dielectric material and the gate spacer layer to form a third recess, and filling the third recess with a third dielectric material having a third composition, wherein the third composition is different from the first composition and different from the second composition. In an embodiment, the method includes forming a source/drain contact plug, including etching the second dielectric material and the third dielectric material to form a fourth recess that exposes the source/drain contact using a first etching process, wherein the first etching process selectively etches the second dielectric material over the gate spacer layer, and filling the fourth recess with a conductive material. In an embodiment, the fourth recess exposes the first dielectric material. In an embodiment, the method includes forming a gate contact plug, including etching the first dielectric material to form a fifth recess that exposes the gate stack using a second etching process, wherein the second etching process selectively etches the first dielectric material over the third dielectric material, and filling the fourth recess with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a fin protruding from a semiconductor substrate;
   a gate structure over the fin;
   a first dielectric layer comprising a first dielectric material on the gate structure;
   a gate spacer layer along a sidewall of the gate structure and a sidewall of the first dielectric layer, wherein an upper surface of the gate spacer layer is farther from the semiconductor substrate than an upper surface of the gate structure;
   an etch stop layer along the gate spacer layer, wherein an upper surface of the etch stop layer is closer to the semiconductor substrate than an upper surface of the gate spacer layer;
   a source/drain contact adjacent the etch stop layer;
   a second dielectric layer comprising a second dielectric material on the source/drain contact, wherein the second dielectric layer extends over the upper surface of the etch stop layer; and
   a third dielectric layer comprising a third dielectric material on the second dielectric layer, wherein the third dielectric material has a different composition than the second dielectric material, wherein the third dielectric layer extends over the upper surface of the gate spacer layer.

2. The device of claim 1, further comprising a source/drain contact plug extending through the second dielectric layer and the third dielectric layer, the source/drain contact plug physically contacting the source/drain contact.

3. The device of claim 2, wherein a width of the source/drain contact plug is greater than a width of the source/drain contact.

4. The device of claim 2, wherein the source/drain contact plug physically contacts a sidewall of the first dielectric layer and a sidewall of the gate spacer layer.

5. The device of claim 1, further comprising a gate contact plug extending through the first dielectric layer to physically contact the gate structure, wherein the gate contact plug physically contacts the gate spacer layer and the third dielectric layer.

6. The device of claim 1, further comprising a liner layer along the etch stop layer, wherein an upper surface of the liner layer is farther from the semiconductor substrate than an upper surface of the source/drain contact.

7. The device of claim 1, wherein a width of the third dielectric layer is greater than a width of the second dielectric layer.

8. The device of claim 1, wherein an upper width of the second dielectric layer is greater than a lower width of the second dielectric layer.

9. The device of claim 1, wherein the upper surface of the gate spacer layer is farther from the semiconductor substrate than the upper surface of the gate structure by a distance in the range of 1 nm and 30 nm.

10. A semiconductor device, comprising:
 a gate stack;
 a first dielectric material over the gate stack;
 a gate spacer on a sidewall of the gate stack and on a sidewall of the first dielectric material;
 an etch stop layer on a sidewall of the gate spacer opposite the gate stack;
 a source/drain contact adjacent the etch stop layer;
 a second dielectric material over the source/drain contact and over the etch stop layer, the second dielectric material physically contacting the sidewall of the gate spacer;
 a third dielectric material over the second dielectric material and over the gate spacer, the third dielectric material physically contacting a sidewall of the first dielectric material;
 a gate contact extending through the first dielectric material and physically contacting the gate stack and the gate spacer; and
 a source/drain contact plug extending through the second dielectric material and through the third dielectric material and physically contacting the source/drain contact and the sidewall of the gate spacer, the source/drain contact plug extending over the etch stop layer and over the gate spacer.

11. The semiconductor device of claim 10, wherein the gate contact physically contacts a sidewall of the third dielectric material.

12. The semiconductor device of claim 10, wherein the source/drain contact plug has the same width as the third dielectric layer.

13. The semiconductor device of claim 10, further comprising a liner layer extending between the etch stop layer and the source/drain contact.

14. The semiconductor device of claim 10, wherein the third dielectric material is a different dielectric material than the second dielectric material.

15. The semiconductor device of claim 10, wherein the third dielectric material is a different dielectric material than the first dielectric material.

16. The semiconductor device of claim 10, wherein the gate spacer comprises a fourth dielectric material, and wherein the second dielectric material is a different dielectric material than the fourth dielectric material.

17. A method, comprising:
 forming a dummy gate structure over a fin, the fin protruding above a substrate;
 forming a gate spacer layer on sidewalls of the dummy gate structure;
 forming an etch stop layer on sidewalls of the gate spacer layer;
 replacing the dummy gate structure with a gate stack;
 forming a source/drain contact adjacent the etch stop layer;
 recessing the gate stack to form a first recess;
 filling the first recess with a first dielectric material having a first composition;
 recessing the source/drain contact and the etch stop layer to form a second recess;
 filling the second recess with a second dielectric material having a second composition;
 recessing the second dielectric material and the gate spacer layer to form a third recess; and
 filling the third recess with a third dielectric material having a third composition, wherein the third composition is different from the first composition and different from the second composition.

18. The method of claim 17, further comprising forming a source/drain contact plug, comprising:
 etching the second dielectric material and the third dielectric material to form a fourth recess that exposes the source/drain contact using a first etching process, wherein the first etching process selectively etches the second dielectric material over the gate spacer layer; and
 filling the fourth recess with a conductive material.

19. The method of claim 18, wherein the fourth recess exposes the first dielectric material.

20. The method of claim 17, further comprising forming a gate contact plug, comprising:
 etching the first dielectric material to form a fifth recess that exposes the gate stack using a second etching process, wherein the second etching process selectively etches the first dielectric material over the third dielectric material; and
 filling the fourth recess with a conductive material.

* * * * *